(12) United States Patent
Kawahara

(10) Patent No.: US 7,123,639 B2
(45) Date of Patent: Oct. 17, 2006

(54) SEMICONDUCTOR OPTICAL DEVICE AND METHOD OF MAKING THE SAME

(75) Inventor: Takahiko Kawahara, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 199 days.

(21) Appl. No.: 10/882,679

(22) Filed: Jul. 2, 2004

(65) Prior Publication Data
US 2005/0013335 A1 Jan. 20, 2005

(30) Foreign Application Priority Data
Jul. 4, 2003 (JP) ............................ P2003-271129

(51) Int. Cl.
*H01S 5/00* (2006.01)
(52) U.S. Cl. ............................ 372/44.01; 372/43.01; 372/45.01
(58) Field of Classification Search ............. 372/43.01, 372/44.01, 45.01
See application file for complete search history.

(56) References Cited

U.S. PATENT DOCUMENTS

| 6,603,138 B1* | 8/2003 | Arakawa et al. ............ 257/14 |
| 6,741,623 B1* | 5/2004 | Ishikawa et al. .......... 372/45.01 |
| 6,803,596 B1* | 10/2004 | Hata ............................ 257/13 |
| 6,984,840 B1* | 1/2006 | Kuramata et al. ............ 257/11 |
| 2001/0034071 A1* | 10/2001 | Arakawa et al. .............. 438/22 |
| 2002/0061044 A1* | 5/2002 | Kuniyasu et al. ............. 372/48 |
| 2002/0096685 A1* | 7/2002 | Yabusaki et al. ............. 257/79 |
| 2003/0198268 A1* | 10/2003 | Jikutani et al. ............... 372/46 |
| 2004/0101986 A1* | 5/2004 | Kozaki et al. ................ 438/22 |

FOREIGN PATENT DOCUMENTS

| JP | 05-003362 | 1/1993 |
| JP | 08-078784 | 3/1996 |
| JP | 09-331104 | 12/1997 |

* cited by examiner

*Primary Examiner*—Minsun Oh Harvey
*Assistant Examiner*—Delma R. Flores-Ruiz
(74) *Attorney, Agent, or Firm*—McDermott Will & Emery LLP

(57) ABSTRACT

A semiconductor optical device 100 has an n-type semiconductor layer 2, an active layer 3, and a p-type semiconductor portion 4 provided in order on a principal surface 1a of a substrate 1. The p-type semiconductor portion 4 has a ridge portion 40 and a base portion 42, and a contact layer 5 is formed on the ridge portion 40. A first portion 60 of an insulating layer 6 extends along a plane intersecting with the principal surface 1a of the substrate 1, on a side face 4b of the ridge portion 40 and on a side face 5b of the contact layer 5. An end 6a of the first portion 60 is higher than an edge 5c of the side face 5b of the contact layer 5.

17 Claims, 7 Drawing Sheets

SEMICONDUCTOR OPTICAL DEVICE AND METHOD OF MAKING THE SAME

BACKGROUND OF THE INVENTION

1. Field of the Invention

The present invention relates to a semiconductor optical device and a method of making the same.

2. Related Background Art

Document 1 (Japanese Patent Application Laid-Open No. 5-3362) describes a semiconductor optical device having a ridge type waveguide structure. In this ridge type semiconductor optical device, a contact layer is formed on the ridge. An insulating layer covering the ridge and contact layer has an aperture (window) at which a portion of the contact layer is exposed. The aperture is formed, for example, by photolithography using a photomask. However, if the alignment of the photomask is inaccurate, the aperture is not formed at a desired position. Further, the use of the photomask complicates a process of fabricating the semiconductor optical device and increases production cost.

Document 2 (Japanese Patent Application Laid-Open No. 08-078784) and Document 3 (Japanese Patent Application Laid-Open No. 09-331104) describe that an insulating layer on the contact layer has an aperture formed by a self-alignment method without using the above mask alignment and that the contact layer is exposed at the aperture. The self-alignment method is free of misalignment because of no need for the alignment of the mask. In the self-alignment method, the insulating film is formed on a substrate and a photoresist film is formed onto the insulating film. Since the thickness of the photoresist film becomes smaller on the ridge, the photoresist film on the ridge can be selectively removed.

SUMMARY OF THE INVENTION

FIG. 10 is a sectional view showing a structure of a ridge type semiconductor optical device 200 fabricated by the self-alignment method. The semiconductor optical device 200 has a buffer layer 202, an active layer 203, a cladding layer 204 and a contact layer 205, and these layers are provided in turn on the surface 201a of a semiconductor substrate 201. The cladding layer 204 has a ridge 240 and the contact layer 205 is provided on the ridge 240. An insulating layer 206 covers both side faces 204b of the ridge 240 and a part of each side face 205b of the contact layer 205. The contact layer 205 and the insulating layer 206 are covered with a barrier metal layer 207. An upper electrode 209 is provided on the barrier metal layer 207. A lower electrode 208 is provided on a bottom surface of the semiconductor substrate 201. When an electric current of not less than a threshold current is applied to the semiconductor optical device 200, carriers are injected through the upper electrode 209 and lower electrode 208 into the active layer 203 to generate laser light and the laser light is emitted from the semiconductor optical device 200.

In the production of the semiconductor optical device 200, the aperture is formed in the insulating layer 206 by the self-alignment method. In this case, the top surface 205a and a part of each side face 205b of the contact layer 205 are exposed in the aperture. Furthermore, the barrier metal layer 207 is formed to cover the contact layer 205 and the insulating layer 206.

The inventor has prepared semiconductor optical devices fabricated as the semiconductor optical device 200 and have carried out the reliability test thereof. Some of the semiconductor optical devices have failed to exhibit desired reliability. The inventor has investigated these failure devices that do not exhibit desired reliability and have found that metal atoms in the upper electrode 209 diffuse into the contact layer 205. The diffused metal atoms cause defects in the contact layer 205 to degrade the reliability of the semiconductor optical device 200. According to the recipe to form the barrier metal layer 207, the formed film 207 is expected to have the thickness sufficient to assure a satisfactory barrier property. The inventor have proceeded in the further investigation and have found that portions of the barrier metal layer 207 does not have an adequate barrier performance and that these portions of the barrier metal layer 207 is thinner in thickness as compared to an expected thickness range.

It is an object of the present invention to provide a semiconductor optical device which can prevent the diffusion of metal atoms in the electrode, and a method of fabricating the semiconductor optical device.

According to an aspect of the present invention, a semiconductor optical device comprises: a first III–V compound semiconductor region, a semiconductor contact layer, an insulating layer, and a conductive layer. The first III–V compound semiconductor region includes a base portion and a ridge portion. The base portion extends along a predetermined plane and the ridge portion is provided on the base portion and has a top and a side. The semiconductor contact layer is provided on the top of the ridge portion. The contact layer has first and second faces and a side. The first face is opposite to the second face. The ridge portion, the first face of the semiconductor contact layer and the second face of the semiconductor contact layer is arranged in turn along a reference axis intersecting with the predetermined plane. The insulating layer is provided on the base portion and ridge portion of the first III–V compound semiconductor region. The insulating layer includes a wall portion and a cover portion. The cover portion is provided on the base portion. The wall portion has first to third regions. The second region is located between the first region and the third region. The first region is provided on the side of the ridge portion. The second region is provided on the whole side of the contact layer. The conductive layer is provided on the semiconductor contact layer and the insulating layer. The conductive layer covers the whole second face of the contact layer.

According to another aspect of the present invention, a semiconductor optical device comprises a first III–V compound semiconductor region, a contact semiconductor layer, an insulating layer, and a conductive layer. The first III–V compound semiconductor region includes a base portion and a ridge portion. The ridge portion is provided on the base portion and having a side. The contact semiconductor layer has a top face and a side face. The top face extends along a predetermined plane. The ridge portion and the contact layer is arranged along a predetermined axis intersecting with the predetermined plane. The insulating layer is provided on the base portion and ridge portion of the first III–V compound semiconductor region. The insulating layer includes a wall portion and a cover portion. The cover portion is provided on the base portion. The wall portion has first to third regions. The second region is located between the first region and the third region. The predetermined plane is located between the second region and the third region. The first region is provided on the side of the ridge portion. The whole side of the contact layer is provided on the second region. The conductive layer is provided on the contact layer and the insulating layer. The conductive layer covers the whole top surface of the contact layer.

In the semiconductor optical device according to the present invention, the conductive layer includes a barrier metal layer and an electrode provided on the barrier metal layer.

In the semiconductor optical device according to the present invention, the third region of the wall portion has an internal side and an external side. The second region of the wall portion has an internal side and an external side. The internal side of the third region is connected with the internal side of the second region. The contact layer is provided on the whole internal side of the second region. The conductive layer is provided on the internal side and external side of the third region.

In the semiconductor optical device according to the present invention, the semiconductor contact layer has another side opposite to the side thereof. The second face of the semiconductor contact layer extends from an edge of the side of the semiconductor contact layer to an edge of the other side.

In the semiconductor optical device according to the present invention, the semiconductor contact layer has another side opposite to the side thereof. The ridge portion has another side opposite to the side thereof. The wall portion has fourth to six regions and the fifth region is located between the fourth region and the sixth region. The fourth region is provided on the other side of the ridge portion and the fifth region is provided on the other whole side of the contact layer. The third region of the wall portion has an internal side and an external side and the sixth region of the wall portion has an internal side and an external side. A distance between the internal side of the third region and the internal side of the sixth region is not less than a width of the second face of the contact layer.

The semiconductor optical device according to the present invention further comprises: a substrate; a second semiconductor layer provided between the substrate and the first semiconductor region; and an active layer provided between the second semiconductor layer and the first semiconductor region. The conductivity type of the first semiconductor region is different from a conductivity type of the second semiconductor layer.

In the semiconductor optical device according to the present invention, the contact layer is made of a p-type III–V compound semiconductor, the barrier metal layer is made of a metal containing platinum (Pt), and the electrode is made of a metal containing gold (Au).

In the semiconductor optical device according to the present invention, the barrier metal layer has a thickness of not more than 100 nanometers.

In the semiconductor optical device according to the present invention, the ridge portion has a width of not more than 3 micrometers (μm).

Still another aspect of the present invention is a method of producing a semiconductor optical device. The method comprises the steps of: preparing a substrate including a first semiconductor film of a first conductivity type and a contact semiconductor film provided thereon; forming a second semiconductor film on the contact film; forming, on the second semiconductor film, a mask for a ridge portion; etching the second semiconductor film by use of the mask to form a second semiconductor layer on the contact semiconductor film; after etching the second semiconductor film, etching the contact semiconductor film and the first semiconductor layer by use of the mask to form a contact layer and the ridge portion; forming an insulating film over the ridge portion, the contact layer, and the second semiconductor layer; partially etching the insulating film to expose the second semiconductor layer; after partially etching the insulating film, removing the second semiconductor layer; and forming a conductive film on the contact layer.

In the method according to the present invention, forming the conductive film on the contact layer comprises the steps of forming a barrier metal film on the contact layer; and forming a metal film on the barrier metal film.

DETAILED DESCRIPTION OF THE PREFERRED EMBODIMENTS (First Embodiment)

Figure 1:
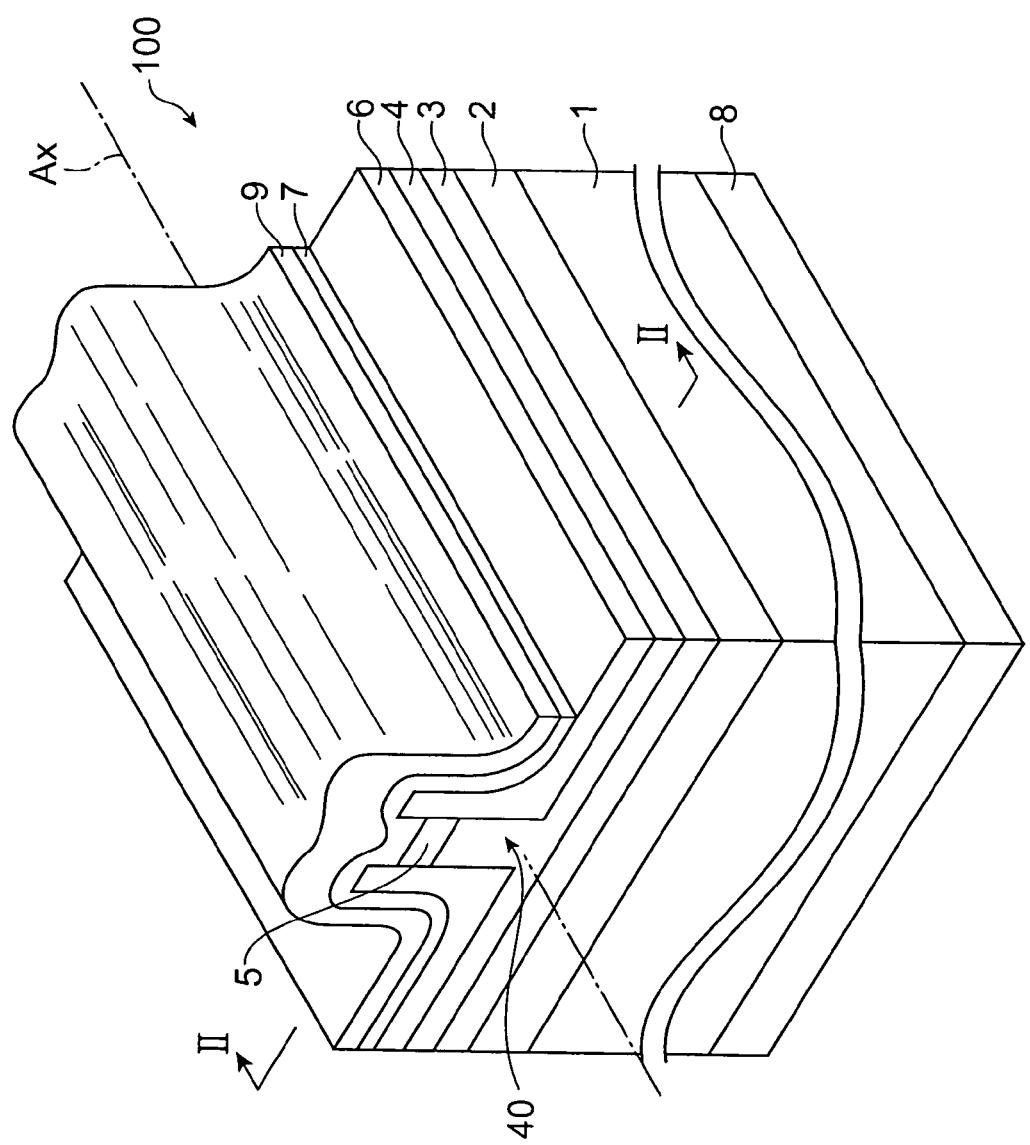
FIG. 1 is a perspective view showing a semiconductor optical device according to one embodiment.
Figure 2:
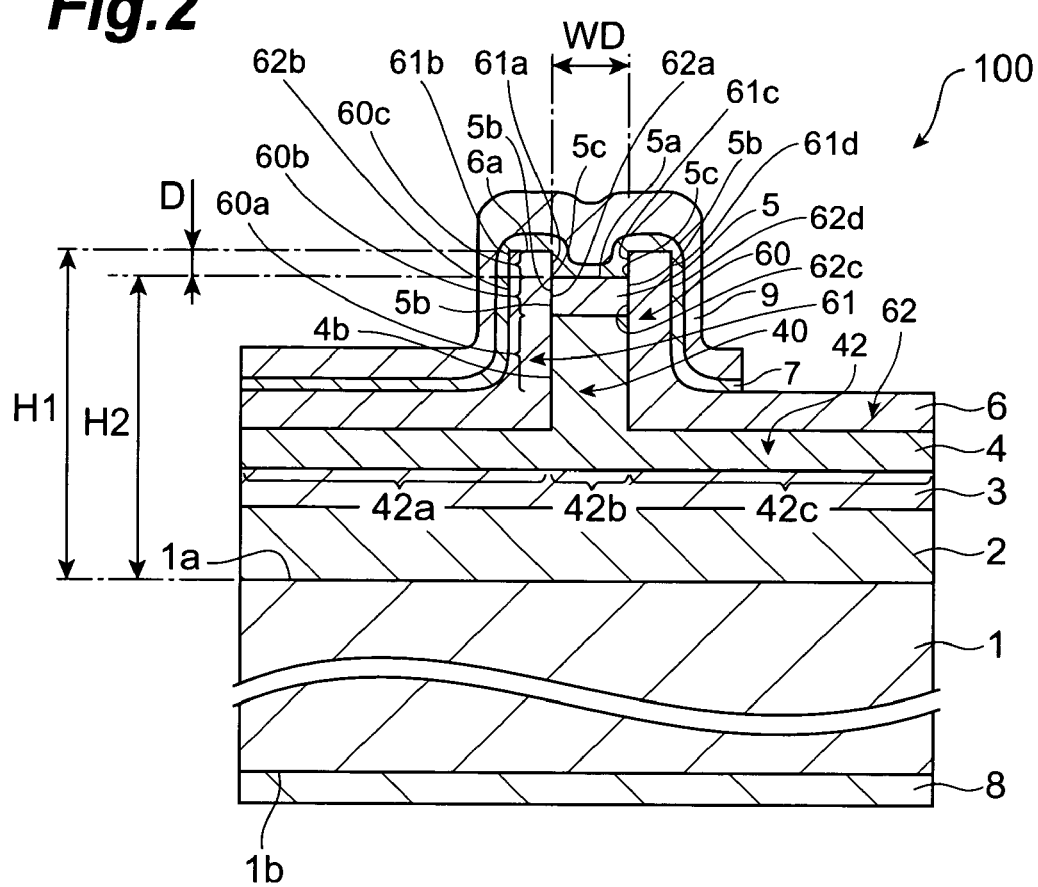
FIG. 2 is a cross sectional view, taken along the line II—II, of the semiconductor optical device according to the embodiment.

FIG. 1 is a perspective view showing a semiconductor optical device 100 according to an embodiment of the present invention. FIG. 2 is a cross sectional view showing the semiconductor optical device 100, taken along the line II—II, according to the embodiment. The semiconductor optical device 100 can be, for example, a ridge type Fabry-Pérot laser diode having a refractive index-guiding structure.

The semiconductor optical device 100 has a first conductivity type semiconductor layer 2, an active layer 3, and a second conductivity type semiconductor portion 4 which are provided in turn on a primary surface 1a of a substrate 1. The second conductivity type semiconductor layer may be, for example, an n-type semiconductor layer 2, and the first conductivity type semiconductor portion may be, for example, a p-type semiconductor portion 4. In the description hereinafter, the first conductivity type semiconductor portion and the second conductivity type semiconductor layer are written as a p-type semiconductor portion 4 and as the n-type semiconductor layer 2, respectively, in order to facilitate the understanding of the semiconductor optical device 100.

As shown in FIG. 2, the p-type semiconductor portion 4 includes a raised portion, such as ridge portion 40, and a base portion 42. The base portion 42 has first to third regions 42a, 42b, and 42c arranged in order along a predetermined axis. The ridge portion 40 is provided on the second region 42b. A contact layer 5 is provided on the top surface of the ridge portion 40.

The ridge portion 40 and contact layer 5 are provided between both side portions of the insulating layer 6. The insulating layer 6 is made of silicon oxide, such as $SiO_2$. The insulating layer 6 has a first wall portion 60, a second wall portion 61 and a cover portion 62. Each of the first wall portion 60 and second wall portion 61 extends along a reference plane that intersects with the primary surface 1a of the substrate 1 to form a wall.

The first wall portion 60 and second wall portion 61 of the insulating layer 6 are provided on each side face 4b of the ridge portion 40 and each side face 5b of the contact layer. In the insulating layer 6, each of the first insulating portion 60 and second insulating portion 61 includes a first region 60a, a second region 60b and a third region 60c. The second region 60b is located between the first region 60a and the third region 60c. Ends 6a of the first and second wall portions 60, 61 are higher than upper edges 5c of the side faces 5b of the contact semiconductor layer 5. For example, the distance (height H1) between the primary surface 1a and one of the ends 6a is higher than the distance (height H2) between the primary surface 1a and one of the edges 5c by a value D. This value D is, for example, greater than zero nanometers and not more than one micrometer (0<x<1 micrometer), and favorably greater than 0.1 micrometers and not more than 0.5 micrometers (0.1 micrometers <x<0.5 micrometers). The insulating portion 62 of the insulating layer 6 is provided on the first and third regions 42a, 42c of the base portion 42. The insulating layer 6 is not provided on the entire top surface 5a of the contact semiconductor layer 5. The top surface 5a of the contact semiconductor layer 5 is exposed at an aperture of the insulating layer 6 provided above the ridge portion 40.

The third region 60c of the first wall portion 60 has an internal side 61c and an external side 61d. The third region 60c of the second portion 61 has an internal side 61a and an external side 61b. The second region 60b of the second wall portion 61 has an internal side 62a and an external side 62b. The second region 60b of the first wall portion 60 has an internal side 62c and an external side 62d. In the first wall portion 60, the internal side 61a of the third region 60c is continuous with the internal side 62a of the second region 60b. In the second wall portion 61, the internal side 61c of the third region 60c is continuous with the internal side 62c of the second region 60b. The barrier metal layer 7 is provided on both the internal sides 61a, 61c and the external sides 61b, 61d of each third region 60c.

The distance between the internal side 61a and the internal side 61c is substantially equal to or slightly larger than the width of the top surface 5a of the contact semiconductor layer 5.

A barrier metal layer 7 is provided on the contact layer 5 and the insulating layer 6. The barrier metal layer 7 covers the entire top surface 5a of the contact layer 5 and extends along the internal wall surfaces 61a, 61c of the first and second wall portions 60, 61. The barrier metal layer 7 covers the ends 6a of the first and second wall portions 60, 61 and extends along the external wall surfaces 61b, 61d of the first and second wall portion 60, 61. An upper electrode 9 is provided on the barrier metal layer 7. A bottom electrode 8 is provided on a surface 1b opposite to the primary surface 1a of the substrate 1.

The n-type semiconductor layer 2, active layer 3, p-type semiconductor portion 4, contact layer 5, insulating layer 6, barrier metal layer 7, bottom electrode 8, and top electrode 9 are provided on the substrate 1. When current exceeding a threshold is injected through the top electrode 9 and bottom electrode 8 into the active layer 3, the active layer 3 generates light in response to the injection of carriers, so that the semiconductor optical device 100 emits the laser light.

The substrate 1 is made of n-type semiconductor such as InP. The n-type semiconductor layer 2 is formed in the thickness of 1 micrometer on the primary surface 1a of the substrate 1. The n-type semiconductor layer 2 is made of n-type semiconductor such as InP. The n-type semiconductor layer 2 can include a lower cladding layer and/or a buffer layer. The refractive index of the n-type semiconductor layer 2 is lower than that of the active layer 3. The dopant concentration in the n-type semiconductor layer 2 is, for example, $1 \times 10^{18}$ cm$^{-3}$.

The active layer 3 is made, for example, of undoped AlGaInAs. The emission wavelength of light from the active layer 3 is in, for example, the 1.3 micrometer (μm) band. The active layer 3 can have the multiple quantum well structure. In the multiple quantum well structure, a plurality of well layers and barrier layers are alternately arranged.

The p-type semiconductor portion 4 is made of a p-type semiconductor such as p-type InP. Preferably, the p-type semiconductor portion 4 has an upper cladding layer. The refractive index of the p-type semiconductor portion 4 is lower than that of the active layer 3. The dopant concentration in the p-type semiconductor portion 4 is, for example, $1 \times 10^{18}$ cm$^{-3}$.

The ridge portion 40 and the base portion 42 are made of the same material as the p-type semiconductor portion 4. The ridge portion 40 and base portion 42 are made of a p-type semiconductor (first conductivity type semiconductor) such as p-type InP. The distance between the top surface of the ridge portion 40 and the bottom surface of the base portion 42 is, for example, 1.5 micrometers (μm).

The width WD of the ridge portion 40 is, for example, 2 micrometers (μm). The width WD of the ridge portion 40 corresponds to the full width of the top surface of the ridge portion 40 and is substantially equal to the width of the top surface 5a of the contact layer 5. In order to expose the contact layer 5 in the semiconductor optical device having the width WD not more than 3 micrometers (μm), it is preferable to use self-alignment methods free of the occurrence of misalignment. If the width WD of the ridge portion 40 is not more than 3 micrometers (μm), the photolithography process cannot be used to expose the contact layer 5 because of the occurrence of misalignment. That is, the way to form the first and second well portions 60 and 61 of the insulating layer 6 is the self-alignment methods, not photolithography methods with the alignment of masks.

The contact semiconductor layer 5 is made of a p-type III–V compound semiconductor such as p-type GaInAs. The dopant concentration in the contact layer 5 is, for example, $5 \times 10^{18}$ cm$^{-3}$. The contact semiconductor layer 5 has the thickness of, for example, 0.5 micrometers (μm).

The barrier metal layer 7 is made, for example, of platinum (Pt). The barrier metal layer 7 has the thickness of 50 nanometers (nm), for example. The thickness of the barrier metal layer 7 is preferably not more than 100 nanometers (nm), for example. When the thickness of the barrier metal layer 7 is over 100 nanometers (nm), the semiconductor optical device 100 may fail to achieve desired reliability because stress becomes high at the interface between the barrier metal layer 7 and the insulating layer 6. The amount of platinum (Pt) for the barrier metal layer 7 is increased in proportion to the thickness of the barrier metal layer 7. This increases the production cost.

The lower electrode 8 is provided on the bottom surface of the substrate 1. For example, the lower electrode 8 is made of AuGeNi and is used as a cathode. The upper electrode 9 is provided on the barrier metal layer 7. For example, the upper electrode 9 is made of Ti/Pt/Au and is used as an anode.

The barrier metal layer 7 is provided between the upper electrode 9 and the contact layer 5, in order to prevent the metal atoms in the upper electrode 9 from diffusing into the contact layer 5. T the metal atoms, such as gold (Au) atoms, in the upper electrode 9 diffuse into the contact layer 5. If the upper electrode 9 is made of a metallic material containing gold (Au), the barrier metal layer 7 is preferably made of a metallic material containing platinum (Pt).

Figure 10:
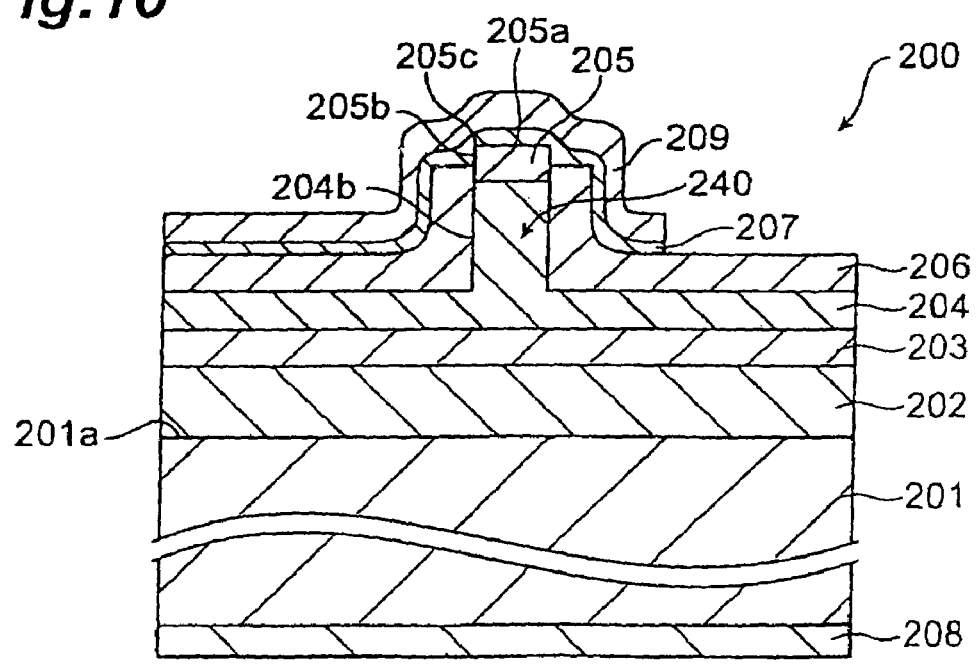
FIG. 10 is a cross sectional view showing a ridge type semiconductor optical device fabricated by the self-alignment method.

In the semiconductor optical device 100, since the ends 6a of the first and second portions 60 and 61 is higher than the edges 5c of the side faces 5b of the contact layer 5, the barrier metal layer 7 is not provided both on the side faces 5b and the top surface 5a of the contact layer 5 and is provided on the top surface 5a of the contact layer 5. The barrier metal layer 7 is provided so as not to cover the edges 5c from the top surface 5a to the side faces 5b of the contact layer 5. Thus, the barrier metal layer 7 does not become thinner at the edges 5c of the side faces 5b of the contact layer 5. In contrast, the semiconductor optical device 200 shown in FIG. 10 has a barrier metal layer 207 that becomes thinner at the upper edge lines 205c of the side faces 205b of the contact layer 205.

In the semiconductor optical device 100, therefore, the barrier metal layer 7 does not cover the side faces 5b of the contact layer 5 across the edge lines 5c, so that the barrier metal layer 7 does not have areas thinner than the other. It is thus feasible to prevent the metal atoms in the upper electrode 9 from diffusing through the barrier metal layer 7 into the contact layer 5. This suppresses occurrence of defects in the contact layer 5 due to the diffused metal atoms, thus enhancing the reliability of the semiconductor optical device 100.

In the semiconductor optical device 100, the insulating layer 6 extends along the plane intersecting with the primary surface 1a of the substrate 1 and the insulating layer 6 does not cover the whole top surface 5a of the contact layer 5. This structure of the insulating layer 6 can be suitably formed by the self-alignment method free of the occurrence of misalignment, unlike in the photolithography process. Furthermore, the self-alignment method is simpler in production steps than photolithography processes.

Figure 11:
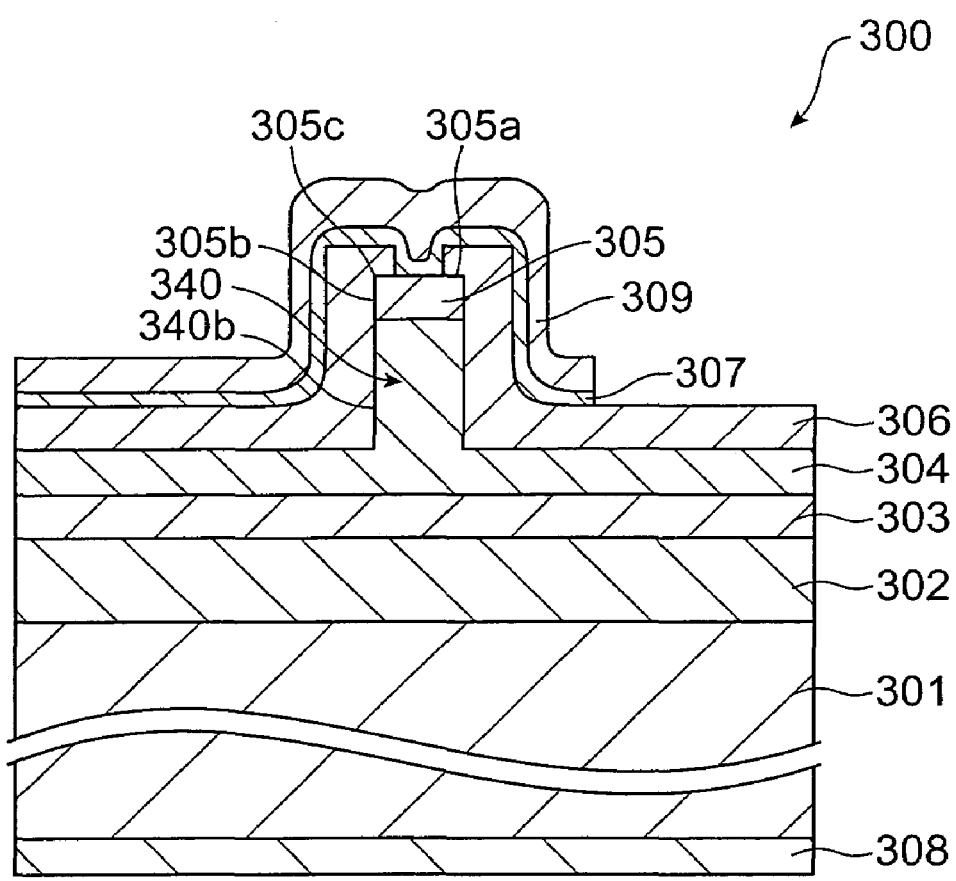
FIG. 11 is a cross sectional view showing a ridge type semiconductor optical device as a comparative example.

FIG. 11 is a cross sectional view showing the structure of a ridge type semiconductor optical device 300 as a comparative example. In the semiconductor optical device 300, an insulating layer 306 covers side faces 340b of ridge portion 340, side faces 305b of contact layer 305 and a part of a top surface 305a of contact layer 305. In FIG. 11, reference character 305 denotes a p-type semiconductor layer, reference character 303 denotes an active layer, reference character 304 denotes a p-type semiconductor portion, and reference character 309 denotes an upper electrode.

Since the semiconductor optical device 300 has the insulating layer 306 of the above structure, the above structure cannot be formed by the self-alignment method and is formed by a photolithography process that uses a photomask and increases the number of production steps as compared with the self-alignment method.

Furthermore, the photolithography process is likely to cause misalignment, and it is difficult to form an aperture of the insulating layer 306 at a desired position. Particularly, if the width of the ridge portion 340 is, for example, as small as about 3 micrometers (μm), the insulating layer 306 fails to suitably cover upper edges 305c of the side faces 305b of the contact layer 305 and the barrier metal layer 307 covers the uncovered upper edges 305c. The thickness of the barrier metal layer 307 at those edges is thinner than the other. Consequently, gold atoms (Au) diffuse into the contact layer through the thinner portions of the barrier metal layer 307 and this diffusion degrades the reliability.

In contrast, the semiconductor optical device according to the present embodiment has the structure in which the edges 5c are not covered with the barrier metal layer 7. Thus, this structure can prevent gold atoms (Au) from diffusing into the contact layer. The semiconductor optical device according to the present embodiment has the structure in which the width of the contact window is the same as the width of the ridge portion. This structure also prevents the contact resistance at the contact window from increasing.

(Second Embodiment)

With reference to FIGS. 3 to 9 a method of making the semiconductor optical device 100 according to another embodiment will be described below. FIGS. 3 to 9 are cross sectional views showing steps for making semiconductor optical devices according to the second embodiment. In this method, the steps as shown in FIGS. 3 to 9 are sequentially carried out to make the semiconductor optical device 100.

(Substrate Preparation Step)

Figure 3:
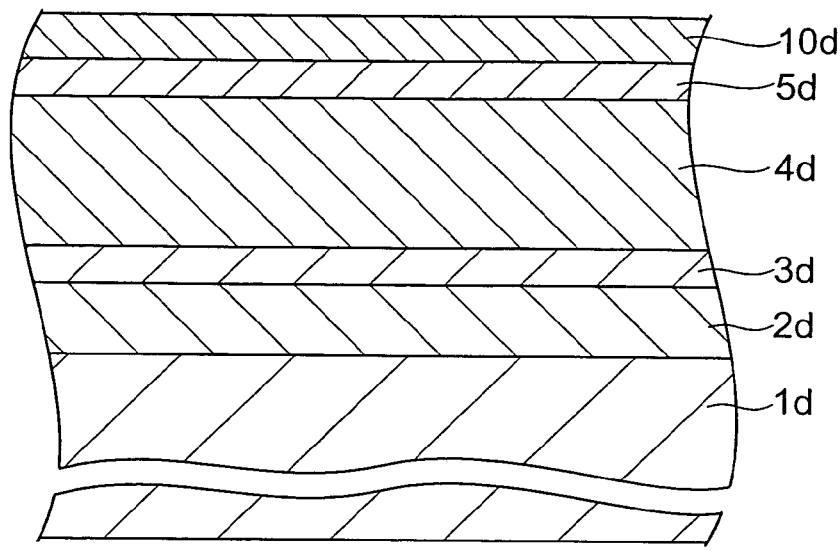
FIG. 3 is a cross sectional view showing a step of forming semiconductor layers on the substrate according to another embodiment.

As shown in FIG. 3, an n-type semiconductor film 2d, a semiconductor film 3d for an active layer, a p-type semiconductor film 4d, and a semiconductor film 5d for a contact layer are sequentially formed on a substrate such as a wafer id by organometallic vapor phase epitaxy (OMVPE). These films 2d to 5d are grown on the surface of the wafer 1d, and the film 2d covers the entire surface of the wafer 1d to prepare an epitaxial wafer including the wafer 1d and the semiconductor films 2d to 5d grown in turn thereon.

For example, the n-type semiconductor film 2d has the thickness of 1 micrometer (μm), the p-type semiconductor film 4d has the thickness of 1.5 micrometers (μm), and the contact film 5d has the thickness of 0.5 micrometers (μm). The substrate 1, the n-type semiconductor layer 2, the active layer 3 and the p-type semiconductor portion 4 in the semiconductor optical device 100 shown in FIG. 2 correspond to the wafer 1d, the n-type semiconductor film 2d, the semiconductor film 3d and the p-type semiconductor film 4d, respectively.

(Second Semiconductor Film Forming Step)

As shown in FIG. 3, a p-type semiconductor film 10d is formed on the semiconductor film 5d. The p-type semiconductor film 10d is made, for example, of p-type InP and is grown by organometallic vapor phase epitaxy. The dopant concentration in the p-type semiconductor film 10d is, for example, about $1 \times 10^{18}$ cm$^{-3}$. The p-type semiconductor film 10d has the thickness of about 0.5 micrometers (μm), for example.

(Mask Forming Step)

Figure 4:
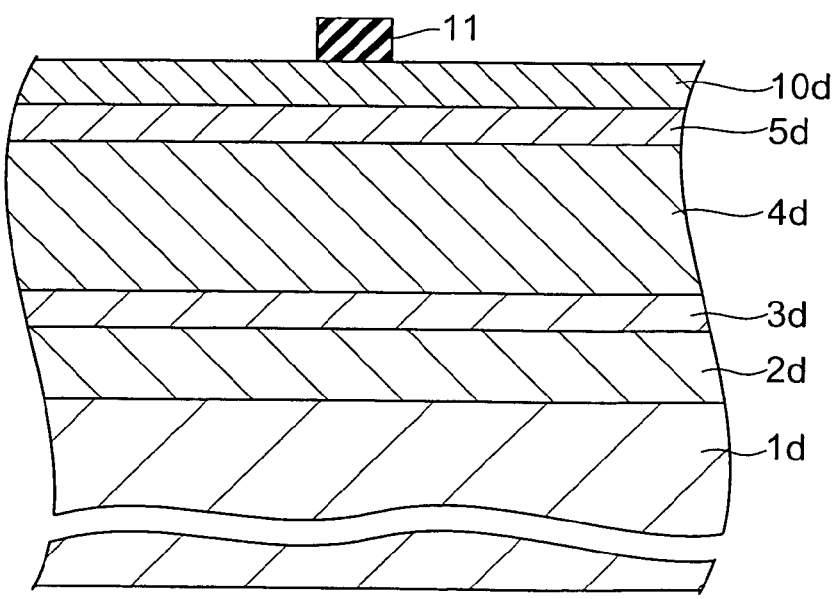
FIG. 4 is a cross sectional view showing a step of forming a mask and contact layer according to the embodiment.

With reference to FIG. 4, in order to form the ridge portion 40 shown in FIG. 2, a mask 11 of a stripe shape is formed on the p-type semiconductor film 10d. The mask 11 is made of an inorganic insulating film, such as silicon nitride (SiN). The mask 11 has the thickness of 0.1 micrometers (μm), for example. The mask 11 can be patterned by photolithography.

(Second Semiconductor Layer Forming Step)

The p-type semiconductor film 10d is etched by use of the mask 11 to form a p-type semiconductor layer 10 on the semiconductor film 5d. The etching step can be carried out by reactive ion etching (RIE) methods. The etching depth is, for example, 0.5 micrometers (μm).

(Contact Layer and Ridge Forming Step)

Figure 5:
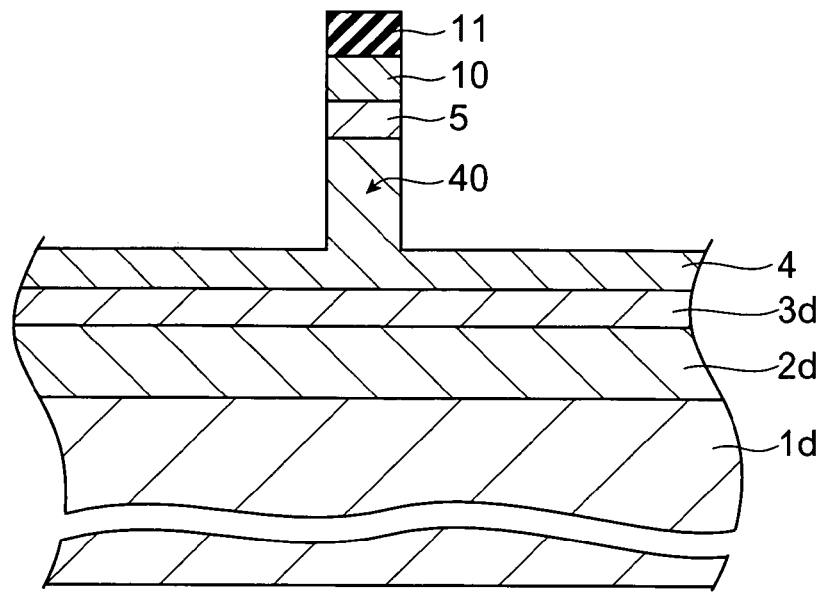
FIG. 5 is a cross sectional view showing a step of forming a ridge portion and a contact layer according to the embodiment.

After the formation of the p-type semiconductor layer 10, the semiconductor film 5d and p-type semiconductor film 4d are sequentially etched by use of the mask 11 to form the contact layer 5 and the ridge portion 40 as shown in FIG. 5. The ridge portion 40 has a stripe shape that corresponds to the pattern of the mask 11. The width of the ridge portion 40 and the width of the contact layer 5 are determined by the pattern of the mask 11 and are approximately equal to the width of the pattern of the mask 11. This etching process can be carried out by reactive ion etching (RIE) methods. The etching depth is, for example, 1.5 micrometers (μm).

(Insulating Film Forming Step)

Figure 6:
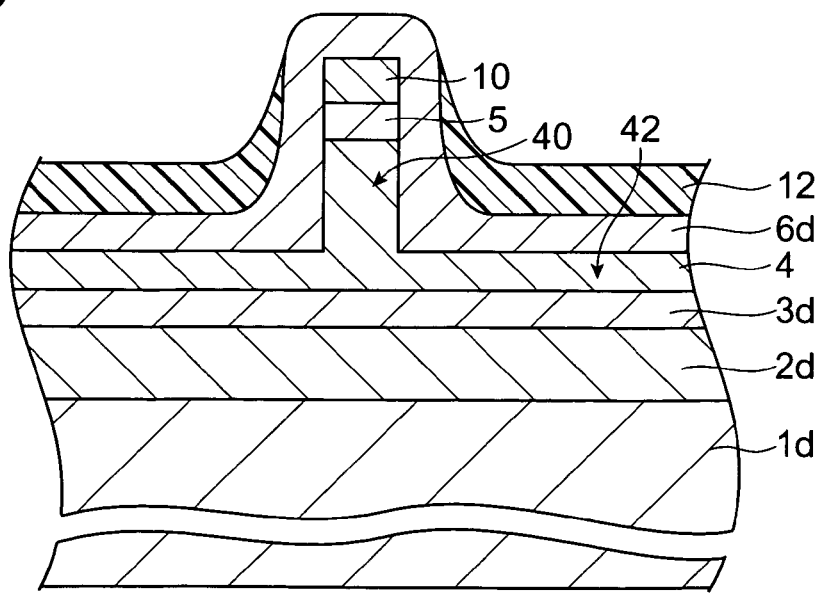
FIG. 6 is a cross sectional view showing a step of forming an insulating film and a resist film according to the embodiment.

After the removal of the mask 11, an insulating film 6d is formed to cover the ridge portion 40, the base portion 42, the contact layer 5 and the p-type semiconductor layer 10 as shown in FIG. 6. A silicon oxide film (for example, $SiO_2$ film) can be used as the insulating film 6d. A photoresist film is formed over the insulating film 6d. The thickness of the photoresist film on the ridge portion 40 is thinner than that on the others, and thus the thinner portion of the photoresist film can be removed by reactive ion etching (RIE) methods, such as an $O_2$ plasma etching method. After this etching, the insulating film 6d on the ridge portion 40 is exposed as shown in FIG. 6.

(Insulating Film Etching Step)

Figure 7:
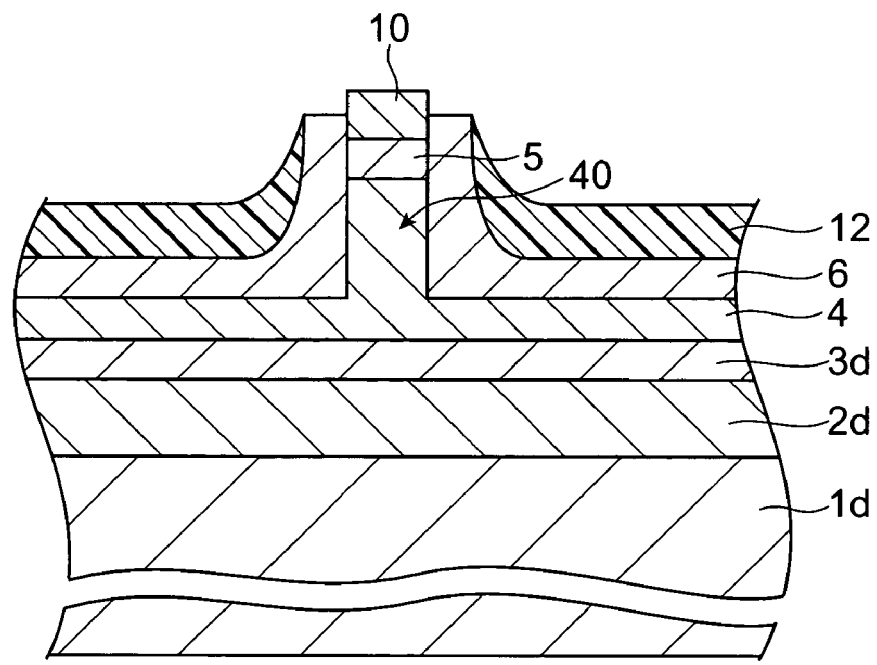
FIG. 7 is a cross sectional view showing a step of fabricating the semiconductor optical device according to the embodiment.

The exposed portion of the insulating film 6d on the ridge portion 40 is etched by use of the resist mask 12 to form an insulating layer 6 with an aperture window as shown in FIG. 7. The insulating layer 6 is formed from the insulating film 6d by a self-alignment method, and the whole top surface and parts of the side surfaces of the p-type semiconductor layer 10 are exposed at the aperture window of the insulating film 6. Although the p-type semiconductor layer 10 is partially exposed at the aperture window, the contact layer 5 is not exposed and covered with the insulating layer 6 and the p-type semiconductor layer 10. Since the self-alignment method is used instead of the photolithography process, there does not occur any misalignment. Furthermore, the self-alignment method makes the production steps simpler.

(Second Semiconductor Layer Removing Step)

Figure 8:
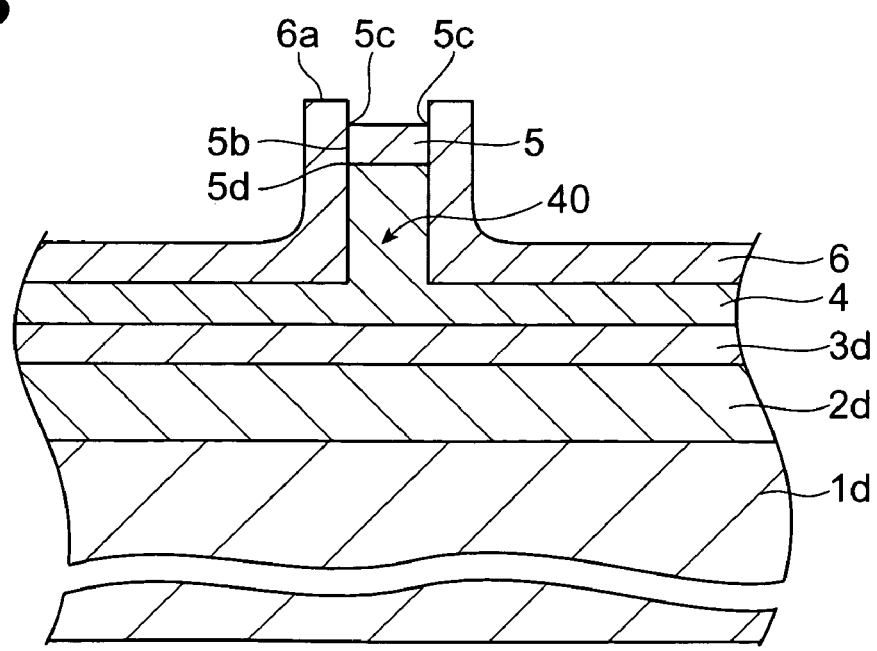
FIG. 8 is a cross sectional view showing a step of etching the insulating film according to the embodiment.

After a part of the insulating film 6 has been etched, the photoresist 12 is removed. As shown in FIG. 8, the p-type semiconductor layer 10 is removed by etching, for example, by wet etching. The wet etching is carried out using a hydrochloric acid etchant. The hydrochloric acid etchant can be, for example, a mixture of HCl and $H_2O$ with a 1 to 1 mixing ratio in volume. Before the etching, the ends 6a of the insulating layer 6 are partially covered with the sides of the p-type semiconductor layer 10. After the etching, the whole top surface 5a of the contact layer 5 is exposed at the aperture window of the insulating layer 6, but the whole sides of the contact layer 5 are covered with the insulating layer 6. The upper edge lines 5c of the side faces 5b are located on the internal surface of the insulating layer 6 and are provided between the lower edge lines 5d of the side faces 5b and the ends 6a of the insulating layer 6.

(Barrier Metal Film Forming Step)

Figure 9:
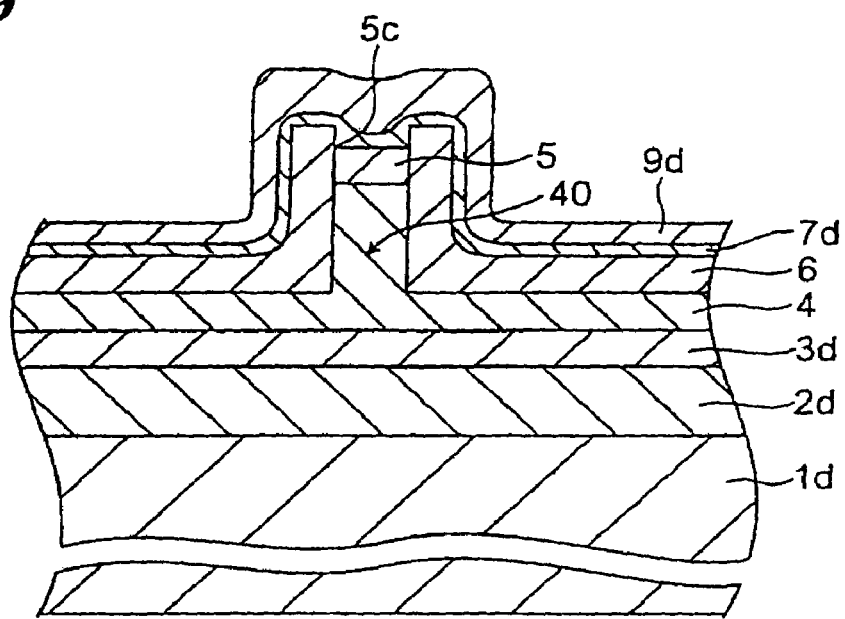
FIG. 9 is a cross sectional view showing a step of forming a barrier metal film and a metal film according to the embodiment.

After the removal of the p-type semiconductor layer 10, a barrier metal film 7d is formed on the contact layer 5 and the insulating layer 6 by vapor deposition as shown in FIG. 9. The barrier metal layer 7 shown in FIG. 2 is formed from the barrier metal film 7d. The barrier metal film 7d is made, for example, of platinum (Pt). The barrier metal film 7d covers the top surface of the contact layer 5 but does not cover the sides of the contact layer 5 because the whole sides of the contact layer 5 are covered with the insulating layer 6. As shown in FIG. 9, the barrier metal film 7d does not cover the edge lines 5c of the contact layer 5 on which the thickness of the barrier metal film 7d would become thinner as compared to that of the other portion of the barrier metal film 7d if the barrier metal film 7d covered the edge lines 5c.

(Metal Film Forming Step)

After the formation of the barrier metal film 7d, a metal film 9d is formed on the barrier metal film 7d by vapor deposition as shown in FIG. 9. The upper electrode 9 shown in FIG. 2 is formed from the metal film 9d. This metal film 9d is made, for example, of a Ti/Pt/Au structure. Thereafter, a metal film is formed on the back surface of the wafer 1d and the lower electrode 8 is formed thereof. This metal film is made, for example, of AuGeNi.

As the result of the above steps, the semiconductor optical device 100 shown in FIG. 2 has been made. As described above, the barrier metal layer 7 in the semiconductor optical device 100 is not provided on the edges of the contact layer, and the semiconductor optical device 100 prevents the metal atoms in the upper electrode 9 from diffusing into the contact layer 5 through thin portions of the barrier metal layer 7, thereby improving the reliability of the semiconductor device 100. Accordingly, the method according to the present embodiment as explained above can provide the semiconductor optical device 100 with high reliability.

The preferred embodiments of the prevent invention has been described above, but the present invention is not limited thereto. For example, although the p-type semiconductor portion 4 is used as the semiconductor region of the first conductivity type and the n-type semiconductor layer 2 is used as the semiconductor layer of the second conductivity type in the above semiconductor optical device 100, the semiconductor region of the first conductivity type and the semiconductor layer of the second conductivity type are made from an n-type semiconductor layer and a p-type semiconductor layer, respectively. Similarly, although the first semiconductor film is formed as the p-type semiconductor film 4d in the steps of manufacturing the semiconductor optical device 100, it may also be formed as an n-type semiconductor film. It is also possible to provide a polyimide resin or BCB resin (Benzocyclobutene) on the insulating film.

In the above semiconductor optical device 100, the material of the second semiconductor film is preferably lattice-matched with the semiconductor material of the contact film 5d. The semiconductor material of the contact film 5d is made of material that exhibits etching resistant against etchant for etching the second semiconductor film. In one example, the second semiconductor film is preferably made of p-type InP if the contact film 5d is made of p-type GaInAs.

In the above embodiments, a Fabry-Pérot laser device is explained as examples of the semiconductor optical device according to the present invention. But, the semiconductor optical device according to the present invention can be another semiconductor optical device, such as a semiconductor light emitting device, a semiconductor light receiving device, a semiconductor integrated optical device, or the like.

What is claimed is:

1. A semiconductor optical device comprising:
   a first III–V compound semiconductor region including a base portion and a ridge portion, the base portion extending along a predetermined plane, and the ridge portion being provided on the base portion and having a top and a side;
   a semiconductor contact layer provided on the top of the ridge portion, the contact layer having first and second faces and a side, the first face being opposite to the second face, and the ridge portion, the first face of the semiconductor contact layer and the second face of the semiconductor contact layer being arranged in turn along a reference axis intersecting with the predetermined plane;
   an insulating layer provided on the base portion and ridge portion of the first III–V compound semiconductor region, the insulating layer including a wall portion and a cover portion, the cover portion being provided on the base portion, the wall portion having first to third regions, the second region being located between the first region and the third region, the first region being provided on the side of the ridge portion, the second region being provided on the whole side of the contact layer; and
   a conductive layer provided on the semiconductor contact layer and the insulating layer, the conductive layer covering the whole second face of the contact layer, wherein
   the conductive layer includes a barrier metal layer and an electrode provided on the barrier metal layer.

2. The semiconductor optical device according to claim 1, wherein the third region of the wall portion has an internal side and an external side,
   wherein the second region of the wall portion has an internal side and an external side,
   wherein the internal side of the third region is continuous with the internal side of the second region,
   wherein the contact layer is provided on the whole internal side of the second region, and
   wherein the conductive layer is provided on the internal side and external side of the third region.

3. The semiconductor optical device according claim 1, wherein the semiconductor contact layer has another side opposite to the side of the semiconductor contact layer, and
   wherein the second face of the semiconductor contact layer extends from an edge of the side of the semiconductor contact layer to an edge of the other side.

4. The semiconductor optical device according to claim 1,
   wherein the semiconductor contact layer has another side opposite to the side thereof,
   wherein the ridge portion has another side opposite to the side thereof,
   wherein the wall portion has fourth to six regions and the fifth region is located between the fourth region and the sixth region,
   wherein the fourth region is provided on the other side of the ridge portion and the fifth region is provided on the whole other side of the contact layer,
   wherein the third region of the wall portion has an first internal side and an external side and the sixth region of the wall portion has an internal side and an external side, and
   wherein a distance between the internal side of the third region and the internal side of the sixth region is not less than a width of the second face of the contact layer.

5. The semiconductor optical device according to claim 1, further comprising:
   a substrate;
   a second semiconductor layer provided between the substrate and the first semiconductor region; and
   an active layer provided between the second semiconductor layer and the first semiconductor region;
   wherein a conductivity type of the first semiconductor region is different from a conductivity type of the second semiconductor layer.

6. The semiconductor optical device according to claim 1, wherein the contact layer is made of a p-type III–V compound semiconductor, the barrier metal layer is made of a metal containing platinum (Pt), and the electrode is made of a metal containing gold (Au).

7. The semiconductor optical device according to claim 1, wherein the barrier metal layer has a thickness of not more than 100 nanometers.

8. The semiconductor optical device according to claim 1, wherein the ridge portion has a width of not more than 3 micrometers.

9. A semiconductor optical device comprising:
   a first III–V compound semiconductor region including a base portion and a ridge portion, the ridge portion being provided on the base portion and having a side;
   a contact semiconductor layer having a top face and a side face, the top face extending along a predetermined plane, and the ridge portion and the contact layer being arranged along a predetermined axis intersecting with the predetermined plane;
   an insulating layer provided on the base portion and ridge portion of the first III–V compound semiconductor region, the insulating layer including a wall portion and a cover portion, the cover portion being provided on the base portion, the wall portion having first to third regions, the second region being located between the first region and the third region, the predetermined plane being located between the second region and the third region, the first region being provided on the side of the ridge portion, the second region being provided on the whole side of the contact layer; and
   a conductive layer provided on the contact layer and the insulating layer, the conductive layer covering the whole top surface of the contact layer, wherein
   the conductive layer includes a barrier metal layer and an electrode provided on the barrier metal layer.

10. The semiconductor optical device according to claim 9, wherein the third region of the wall portion has an internal side and an external side,
    wherein the second region of the wall portion has an internal side and an external side,
    wherein the internal side of the third region is continuous with the internal side of the second region,
    wherein the contact layer is provided on the whole internal side of the second region, and
    wherein the conductive layer is provided on the internal side and external side of the third region.

11. The semiconductor optical device according to claim 9, wherein the semiconductor contact layer has another side opposite to the side thereof, and wherein the second face of the semiconductor contact layer extends from an edge of the side of the semiconductor contact layer to an edge of the other side.

12. The semiconductor optical device according to claim 9,
wherein the semiconductor contact layer has another side opposite to the side thereof,
wherein the ridge portion has another side opposite to the side thereof,
wherein the wall portion has fourth to six regions and the fifth region is located between the fourth region and the sixth region,
wherein the fourth region is provided on the other side of the ridge portion and the fifth region is provided on the whole other side of the contact layer,
wherein the third region of the wall portion has an first internal side and an external side and the sixth region of the wall portion has an internal side and an external side, and
wherein a distance between the internal side of the third region and the internal side of the sixth region is not less than a width of the second face of the contact layer.

13. The semiconductor optical device according to claim 9, further comprising:
a substrate;
a second semiconductor layer provided between the substrate and the first semiconductor region; and
an active layer provided between the second semiconductor layer and the first semiconductor region;
wherein a conductivity type of the first semiconductor region is different from a conductivity type of the second semiconductor layer.

14. The semiconductor optical device according to claim 9, wherein the contact layer is made of a p-type III–V compound semiconductor, the barrier metal layer is made of a metal containing platinum (Pt), and the electrode is made of a metal containing gold (Au).

15. The semiconductor optical device according to claim 9, wherein the barrier metal layer has a thickness of not more than 100 nm.

16. The semiconductor optical device according to claim 9, wherein the ridge portion has a width of not more than 3 micrometers (pm).

17. A method of fabricating a semiconductor optical device, the method comprising the steps of:
preparing a substrate including a first semiconductor film of a first conductivity type and a contact semiconductor film provided thereon;
forming a second semiconductor film on the contact film;
forming, on the second semiconductor film, a mask for a ridge portion;
etching the second semiconductor film by use of the mask to form a second semiconductor layer on the contact semiconductor film;
after etching the second semiconductor film, etching the contact semiconductor film and the first semiconductor layer by use of the mask to form a contact layer and the ridge portion;
forming an insulating film over the ridge portion, the contact layer, and the second semiconductor layer;
partially etching the insulating film to expose the second semiconductor layer;
after partially etching the insulating film, removing the second semiconductor layer, and
forming a conductive film on the contact layer, wherein forming the conductive film on the contact layer comprises the steps of:
forming a barrier metal film on the contact layer; and
forming a metal film on the barrier metal film.

* * * * *